(12) United States Patent
Yang et al.

(10) Patent No.: US 7,778,032 B2
(45) Date of Patent: Aug. 17, 2010

(54) FAN IMPELLER AND HEAT DISSIPATING DEVICE INCORPORATING THE SAME

(75) Inventors: Zhi-Ya Yang, Shenzhen (CN); Wen-Gao Wang, Shenzhen (CN); Xue-Lian Suo, Shenzhen (CN)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

(*) Notice: Subject to any disclaimer, the term of this patent is extended or adjusted under 35 U.S.C. 154(b) by 0 days.

(21) Appl. No.: 12/325,281

(22) Filed: Dec. 1, 2008

(65) Prior Publication Data

US 2009/0310305 A1 Dec. 17, 2009

(30) Foreign Application Priority Data

Jun. 13, 2008 (CN) .................. 2008 1 0067742

(51) Int. Cl.
*H05K 7/20* (2006.01)
*F04D 29/52* (2006.01)

(52) U.S. Cl. ............. 361/697; 361/679.47; 361/679.48; 361/679.54; 361/695; 361/704; 361/709; 415/176; 415/220; 416/182; 416/238; 417/354

(58) Field of Classification Search ................................. 361/679.47–679.49, 679.54, 694–695, 697, 361/704, 709–710; 165/80.3; 174/16.1, 174/16.3; 416/182, 223 R, 231 R, 238, 244 R; 417/313, 354, 366; 415/176, 220
See application file for complete search history.

(56) References Cited

U.S. PATENT DOCUMENTS

| | | | | |
|---|---|---|---|---|
| 3,449,605 A | * | 6/1969 | Wilson | 310/58 |
| 4,225,285 A | * | 9/1980 | Sturm | 415/207 |
| 5,439,352 A | * | 8/1995 | Line | 416/170 R |
| 6,386,276 B1 | * | 5/2002 | Chen et al. | 165/121 |
| 6,773,239 B2 | * | 8/2004 | Huang et al. | 417/354 |
| 6,926,498 B2 | * | 8/2005 | Li et al. | 416/3 |
| 7,004,726 B2 | * | 2/2006 | Kuo | 416/247 R |
| 7,123,483 B2 | * | 10/2006 | Otsuki et al. | 361/710 |
| 7,201,562 B2 | * | 4/2007 | Liu et al. | 415/176 |
| 7,221,567 B2 | * | 5/2007 | Otsuki et al. | 361/695 |
| 7,278,209 B2 | * | 10/2007 | Otsuki et al. | 29/890.047 |
| 7,300,262 B2 | * | 11/2007 | Ku et al. | 417/366 |
| 7,304,844 B2 | * | 12/2007 | Jan et al. | 361/697 |
| 7,411,327 B2 | * | 8/2008 | Watanabe et al. | 310/71 |
| D576,963 S | * | 9/2008 | Mochizuki et al. | D13/179 |
| 7,443,063 B2 | * | 10/2008 | Vinson et al. | 310/58 |

(Continued)

*Primary Examiner*—Jayprakash N Gandhi
*Assistant Examiner*—Robert J Hoffberg
(74) *Attorney, Agent, or Firm*—Frank R. Niranjan

(57) ABSTRACT

A heat dissipation device (1) includes an electric fan (20) and a heat sink (10). The fan includes a fan impeller (40) which includes a hub (41) and a plurality of blades (42) extending radially and outwardly from the hub (41). The hub (41) includes an upper portion (417) and a bottom portion (413). An air inlet (411) is formed near the upper portion (417) and an air outlet (412) is formed near the bottom portion (413). The blades (42) have portions on the bottom portion of the hub which are extended toward a center of the air outlet for driving more air to the center of the air outlet (412), whereby more air can flow to a center of the heat sink.

5 Claims, 4 Drawing Sheets

U.S. PATENT DOCUMENTS

| | | | |
|---|---|---|---|
| 7,455,502 B2 * | 11/2008 | Spaggiari | 416/93 R |
| D584,698 S * | 1/2009 | Ko et al. | D13/179 |
| 7,564,684 B2 * | 7/2009 | Luo | 361/695 |
| 7,607,887 B2 * | 10/2009 | Yang et al. | 415/213.1 |
| 7,623,348 B2 * | 11/2009 | Otsuki et al. | 361/697 |
| 7,660,110 B2 * | 2/2010 | Vinson et al. | 361/679.47 |
| 2003/0007867 A1 * | 1/2003 | Chang | 415/220 |
| 2003/0223865 A1 * | 12/2003 | Horng et al. | 415/220 |
| 2006/0176668 A1 * | 8/2006 | Otsuki et al. | 361/697 |
| 2007/0080590 A1 * | 4/2007 | Vinson et al. | 310/58 |
| 2008/0080137 A1 * | 4/2008 | Otsuki et al. | 361/697 |
| 2008/0107524 A1 * | 5/2008 | Chang et al. | 415/220 |
| 2008/0152502 A1 * | 6/2008 | Luo | 416/223 R |

* cited by examiner

100 # FAN IMPELLER AND HEAT DISSIPATING DEVICE INCORPORATING THE SAME

BACKGROUND

1. Technical Field

The disclosure relates to a heat dissipating device, and particularly to an electric fan having an improved fan impeller and a heat dissipation device having such a fan.

2. Description of Related Art

With continuing development of electronic technology, a heat-generating electric component such as CPU (central processing unit) is generating more and more heat that requires immediate dissipation. Generally a heat sink is thermally attached to the CPU, and an electric fan is mounted on the heat sink for providing an airflow to cool the CPU.

A typical electric fan includes a fan impeller having a cylindrical-shaped sidewall and a plurality of blades extending radially from the sidewall of the fan impeller. A bottom wall of the fan impeller facing the heat sink is flat and is perpendicular to the sidewall. When the blades rotate to generate an airflow flowing to the heat sink, the bottom wall of the fan impeller prevents the airflow from flowing to a center of the heat sink under the fan impeller of the electric fan. Accordingly, an amount of the airflow at the center of the heat sink is approximately zero. However, the center of the heat sink is usually attached to the heat-generating electric component and has more heat than other portion of the heat sink. Thus the airflow provided by the typical electric fan cannot efficiently dissipate heat of the heat sink absorbed from the heat-generating electric component.

Therefore, a heat dissipation device having an improved fan is desired to overcome the above describe shortcomings.

SUMMARY

A heat dissipation device includes a heat sink and a fan. The fan has a fan impeller includes a hub and a plurality of blades extending radially and outwardly from a circumference of the hub. The hub includes an upper portion and a bottom portion, wherein the bottom portion is located near a center of the heat sink. An air inlet is formed at a top surface of the upper portion and an air outlet is formed at a bottom surface of the bottom portion. The blades have bottom portions on the bottom portion of the hub, which are extended toward a center of the air outlet for driving the airflow to the center of the air outlet. More airflow can flow to the center of the hub adjacent to the air outlet.

Other advantages and novel features of the present fan impeller will become more apparent from the following detailed description of preferred embodiments when taken in conjunction with the accompanying drawings, in which:

DETAILED DESCRIPTION OF THE INVENTION

Figure 1:
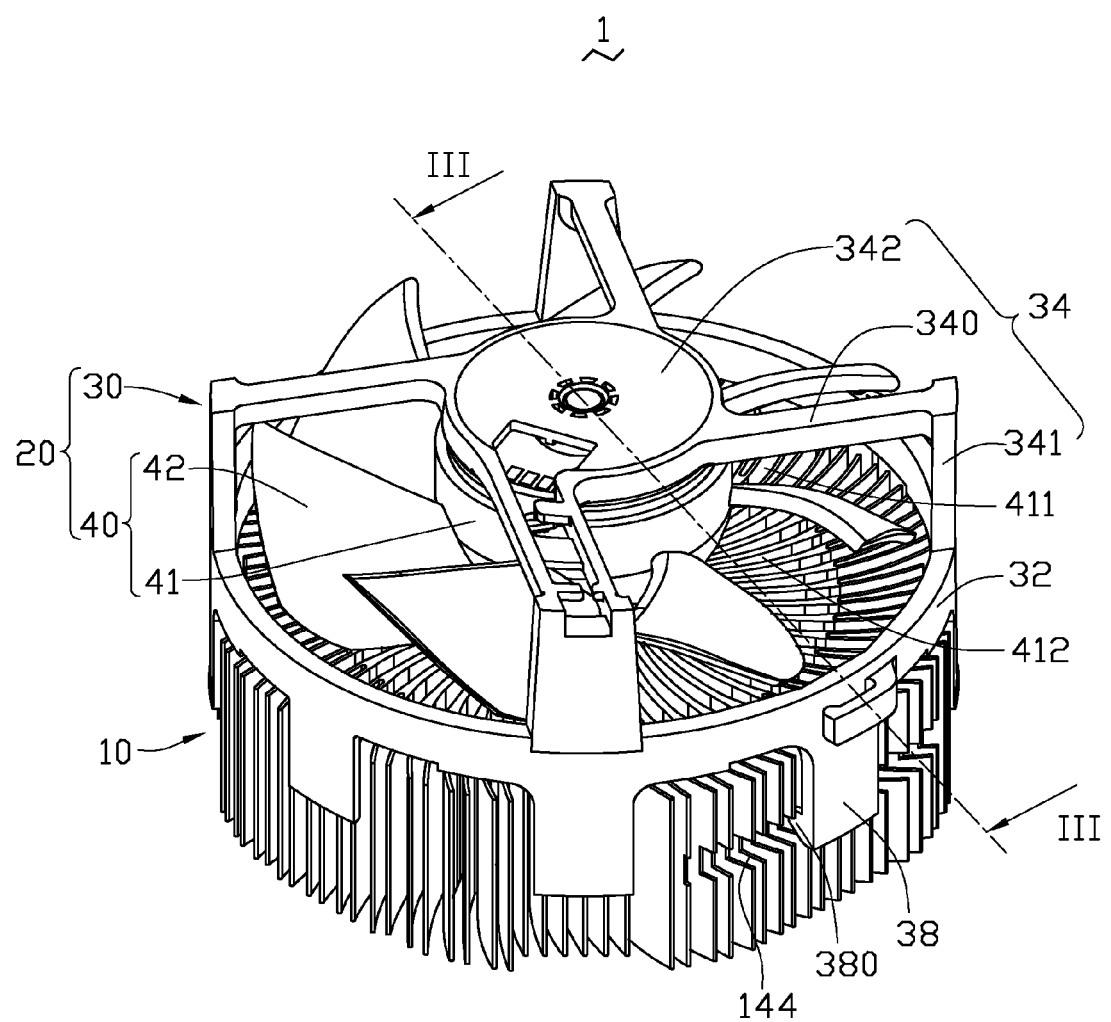
FIG. 1 is an isometric, assembled view of a heat dissipating device, according to a first embodiment.
Figure 2:
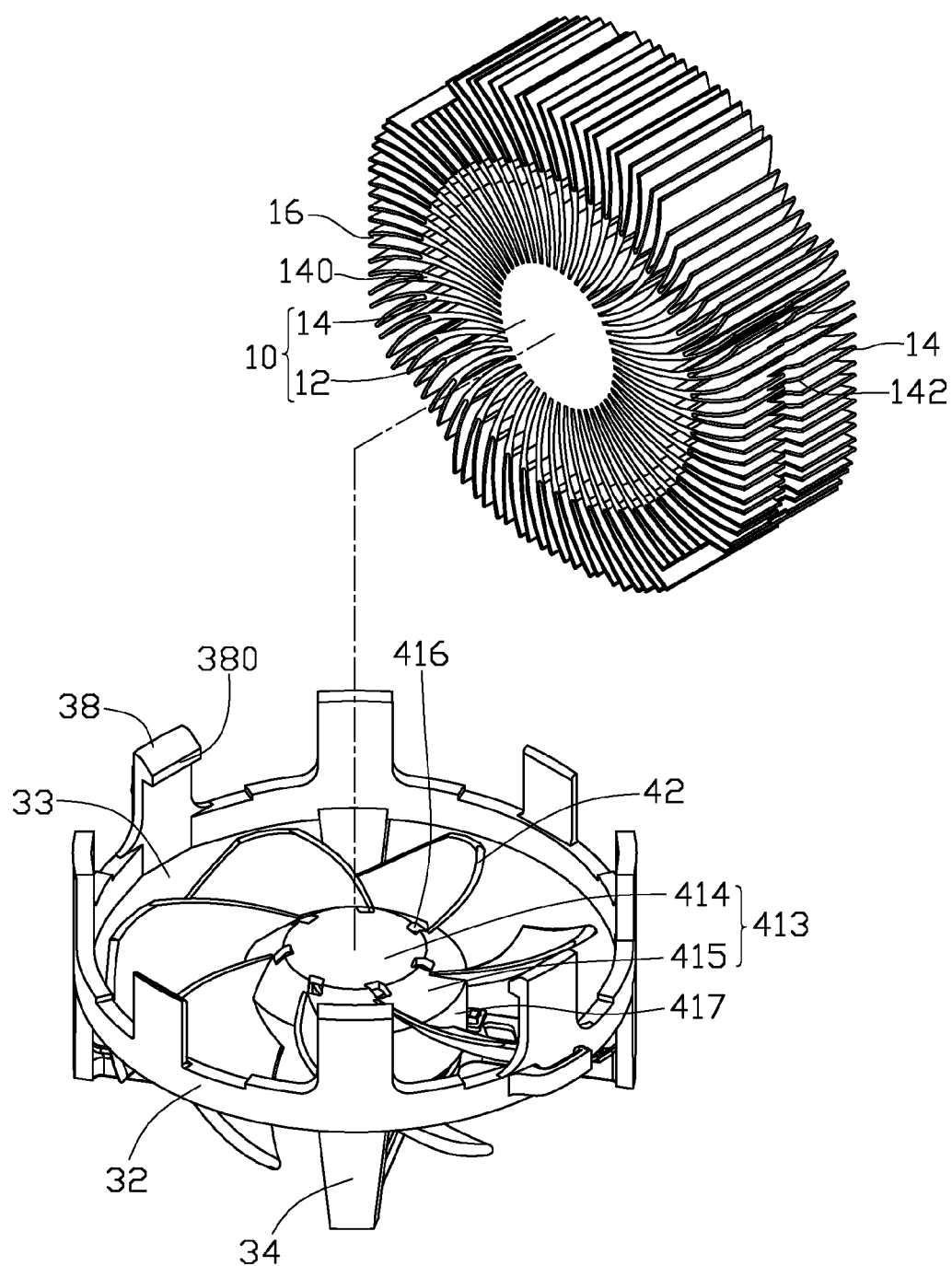
FIG. 2 is an isometric, exploded view of the heat dissipating device of FIG. 1, viewed from another aspect.
Figure 3:
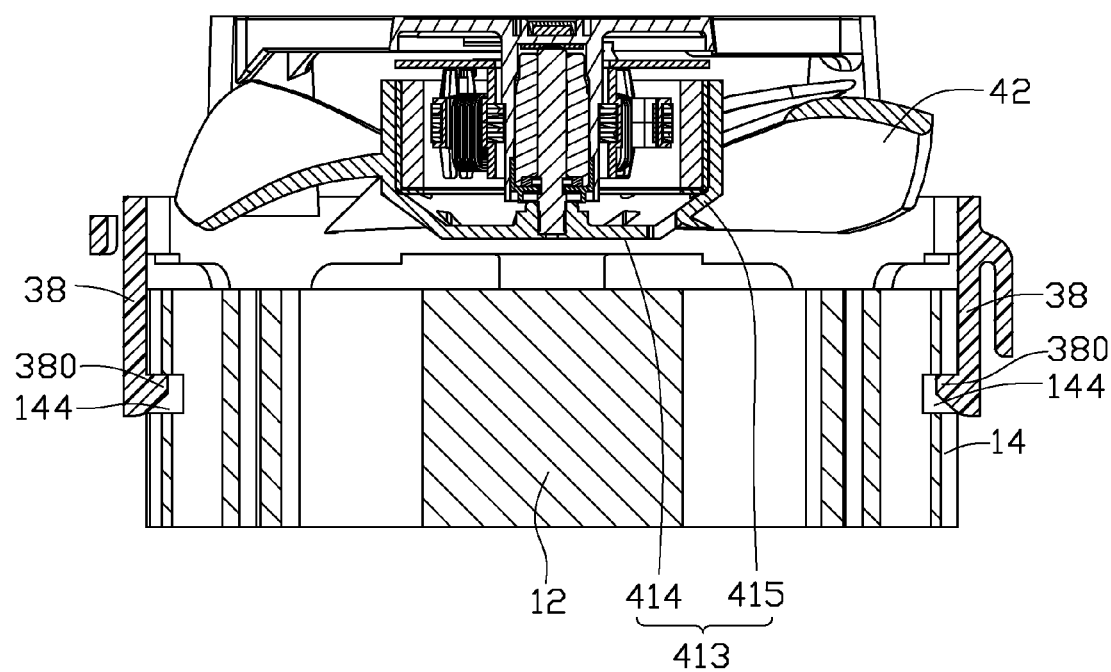
FIG. 3 is a cross-sectional view of the heat dissipating device of FIG. 1, taken along line III-III thereof.

Referring to FIGS. 1-3, a heat dissipating device 1 according to a first embodiment is shown. The heat dissipating device 1 is assembled to a printed circuit board (not shown) on which a heat source (not shown), such as a CPU, is mounted. The heat dissipating device 1 includes a heat sink 10 and an electric fan 20. The electric fan 20 is mounted on the heat sink 10 and generates an airflow flowing through the heat sink 10 to take away heat of the heat sink 10.

The heat sink 10 is substantially column shaped in profile and is made of aluminum or aluminum alloy. The heat sink 10 includes a column-like base portion 12 and a plurality of fins 14 radially and outwardly extending from an outer circumferential surface of the base portion 12. The fins 14 and the base portion 12 are integrally formed as a single piece by extrusion. Alternatively, the base portion 12 can be a copper or copper alloy column with relatively higher thermal conductivity which is press fitted to the fins 14 made of aluminum, aluminum alloy, copper or copper alloy. The fins 14 are equally distributed on the outer circumferential surface of the base portion 12. Each of the fins 14 has a curved profile curving in a direction different from a rotating direction of the electric fan 20. As show in FIG. 1, the fins 14 are curved counterclockwise, while the electric fan 20 is rotated clockwise. Two branches 140 are formed at a free end of each fin 14, increasing heat dissipation area of the heat sink 10. A cutout 142 is defined at a free end of each of the fins 14 at two lateral sides of the heat sink 10. Accordingly, the cutouts 142 at each side of the heat sink 10 cooperatively form a recess 144 (shown in FIGS. 1 and 3) for engagingly receiving a part of the electric fan 20. Two adjacent fins 14 define a channel 16 therebetween.

The electric fan 20 includes a fan bracket 30 and a fan impeller 40 received in the fan bracket 30. The fan bracket 30 includes a substantially circular housing 32, two arm portions 38 extending downwardly from the housing 32, and a support portion 34 extending upwardly from the housing 32. The housing 32 defines a circular hole 33 in a middle portion of the fan bracket 30, functioning as a passage for the airflow.

A hook 380 extends inwardly from a bottom of each arm portion 38. The hook 380 is engaged in the corresponding circumferential recess 144 thereby to fix the electric fan 20 to the heat sink 10.

The support portion 34 includes four support pillar portions 341 extending upwardly from the housing 32 and equidistantly distributed around the circular hole 33, four extending portions 340 respectively extending transversely and inwardly from upper ends of the support pillar portions 341 toward a central axis of the fan bracket 30, and a disk portion 342 fixed to inner ends of the four extending portions 340. The fan impeller 40 is rotatably supported by the disk portion 342 and faces the heat sink 20.

The fan impeller 40 includes a hub 41 and a plurality of blades 42 extending radially and outwardly from an outer circumferential surface of the hub 41. The hub 41 includes an upper portion 417 and a bottom portion 413. An air inlet 411 is formed at a top surface of the upper portion 417 and an air outlet 412 is formed at a bottom surface of the bottom portion 413. The bottom portion 413 and the air outlet 412 are adjacent to the heat sink 10. The bottom portion 413 of the hub 41 faces the heat sink 10 and has a planar-shaped bottom wall 414 and a sidewall 415 extending upwardly and outwardly from an outer-periphery of the bottom wall 414. An outer diameter of the sidewall 415 of the bottom portion 413 gradually decreases along the direction from the air inlet 411 toward the air outlet 412. A plurality of slots 416 are defined in a joint of the bottom wall 414 and the sidewall 415 of the bottom portion 413 for dissipating heat generated by the electric fan 20. The upper portion 417 is cylindrical-shaped and extends upwardly from a top end of the sidewall 415. The upper portion 417 has a diameter the same as the upper end of the sidewall 415 which is relatively larger than that of the bottom wall 414. The blades 42 have bottom portions (not labeled) on the sidewall 415 which are extended towards a center of the air outlet 412 for driving the airflow to the center of the air outlet 412. Thus, more airflow can flow to the center of the air outlet 412. In addition, the sidewall 415 can guide the airflow to the center of the air outlet 412. Therefore, an amount of the airflow driven by the fan impeller 40 to the center of the heat sink 10 is increased. The hub 41 occupies a space smaller than that of the cylinder-shaped hub of the typical electric fan when the diameter of the upper portion 417 of the hub 41 is the same as that of the typical cylinder-shaped hub. Thus the blades 42 can have a relatively larger size. Accordingly, the amount of airflow generated by the blades 42 is increased in comparison with the prior art.

Figure 4:
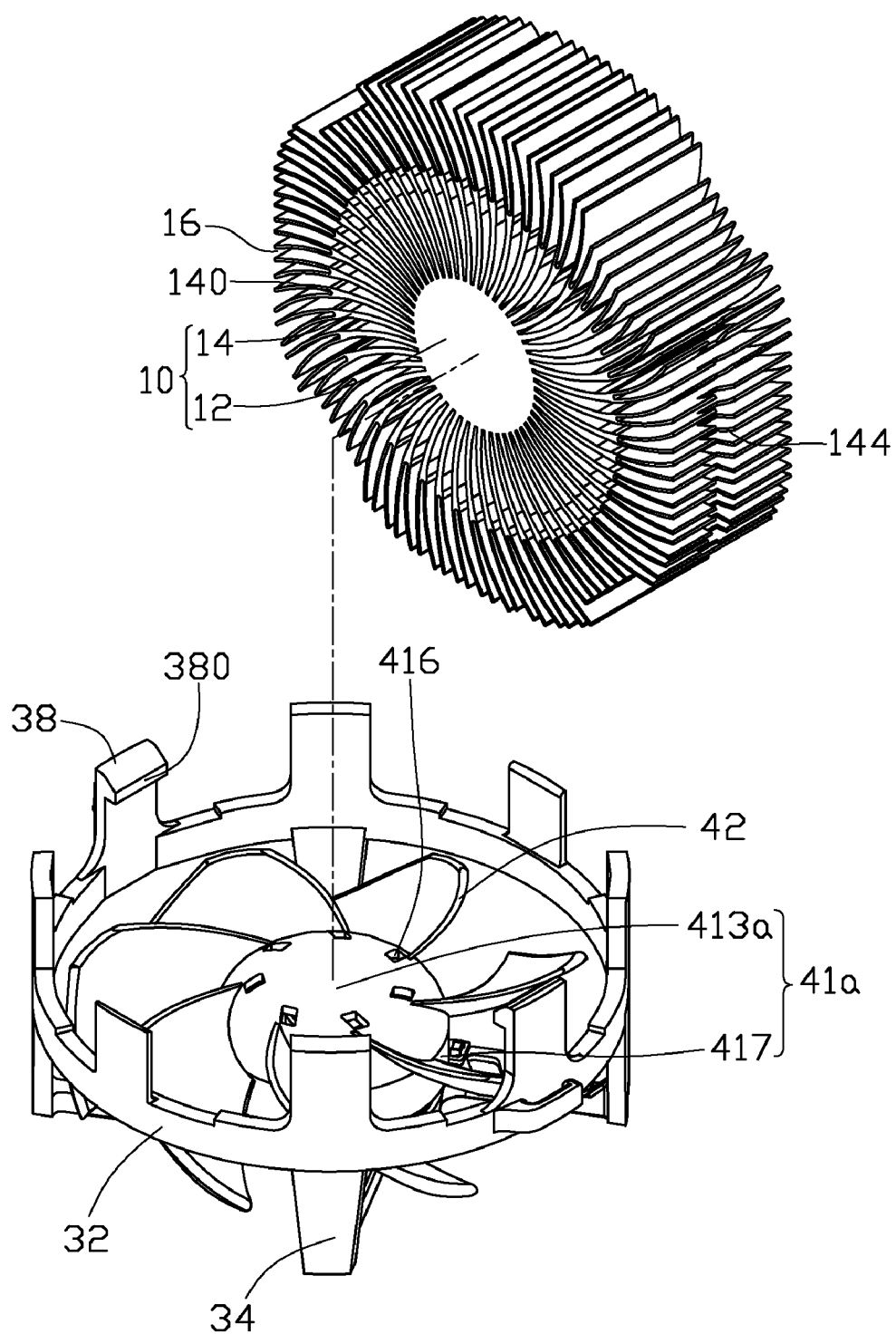
FIG. 4 is an isometric, exploded view of the heat dissipating device according to a second embodiment.

FIG. 4 shows an alternative embodiment. The difference of this embodiment over the previous embodiment is as follows. The bottom portion 413a of the hub 41a is arc-shaped and converges to a point at the bottom end adjacent to the air outlet 412. The volume of the hub 41a can be further decreased, while the size of the blades 42 further increases. Also the blades 42 can generate a relatively larger amount of airflow.

It will be obvious that, within the scope of the invention, many variations are possible to those skilled in the art. The scope of protection of the invention is not limited to the example given herein.

What is claimed is:

1. A heat dissipating device comprising:

a heat sink defining a plurality of channels therethrough; and an electric fan mounted on the heat sink for generating airflow flowing through the channels of the heat sink to take away heat of the heat sink, the electric fan comprising a hub and a plurality of blades extending radially and outwardly from an outer circumference of the hub, the hub forming an air inlet and an air outlet, the air outlet being located between the heat sink and the air inlet, the hub comprising a bottom portion adjacent to the air outlet, the bottom portion having a diameter gradually decreasing along an axial direction from the air inlet towards the air outlet, the blades having portions on the bottom portion of the hub which are extended towards a center of the hub at the air outlet for driving the airflow to a center of the air outlet;

wherein the bottom portion comprises a planar shaped bottom wall and a sidewall extending upwardly and outwardly from an outer periphery of the bottom wall, a plurality of slots are defined at a joint of the bottom wall and the sidewall for dissipating heat of the electric fan, and the slots face the channels defined in the heat sink.

2. A heat dissipating device comprising:

a heat sink comprising a column-shaped base portion and a plurality of fins extending outwardly and radially from an outer circumferential surface of the base portion, a plurality of channels being defined between the fins; and an electric fan mounted on the heat sink and comprising a fan bracket and a fan impeller rotatably received in the fan bracket;

wherein the impeller comprises a hub and a plurality of blades extending radially and outwardly from a circumference of the hub, the hub comprising a bottom portion adjacent to the column-shaped base portion of the heat sink, an outer surface of the bottom portion of the hub contracting along an axial direction from the electric fan toward the heat sink, the blades having portions on the bottom portion of the hub which are extended toward a center of the bottom portion of the hub; and wherein the bottom portion of the hub comprises a planar shaped bottom wall and a sidewall extending upwardly and outwardly from an outer periphery of the bottom wall, a plurality of slots are defined at a joint of the bottom wall and the sidewall for dissipating heat of the electric fan, and the slots face the channels defined in the heat sink.

3. The heat dissipating device as claimed in claim 2, wherein the fins have a curved profile curving in a direction different from a rotating direction of the impeller.

4. The heat dissipating device as claimed in claim 2, wherein two branches are formed at a free end of each fin.

5. The heat dissipating device as claimed in claim 2, wherein the fan bracket comprises a substantially circular housing, and two arm portions extending downwardly from the housing to engage in two opposite recesses circumferentially defined in a periphery of the heat sink, thereby attaching the electric fan to the heat sink.

* * * * *